United States Patent
Tomomatsu (10) Patent No.: US 6,633,473 B1
(45) Date of Patent: Oct. 14, 2003

(54) OVERCURRENT CONTROL CIRCUIT OF POWER SEMICONDUCTOR DEVICE

(75) Inventor: Yoshifumi Tomomatsu, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/807,952

(22) PCT Filed: Sep. 20, 1999

(86) PCT No.: PCT/JP99/05158

§ 371 (c)(1),
(2), (4) Date: Apr. 25, 2001

(87) PCT Pub. No.: WO01/22584

PCT Pub. Date: Mar. 29, 2001

(51) Int. Cl.⁷ .................................................. H02H 3/00
(52) U.S. Cl. ......................................... 361/93.7; 361/58
(58) Field of Search ............................... 361/93.1, 93.7, 361/57, 58; 327/108, 110, 322, 323, 324, 328, 330, 377, 381, 427

(56) References Cited

U.S. PATENT DOCUMENTS 5,559,656 A * 9/1996 Chokhawala ................. 361/18
5,801,573 A   9/1998 Kelly et al.

FOREIGN PATENT DOCUMENTS

| JP | 1-262667 | 10/1989 | | |
|---|---|---|---|---|
| JP | 6-53795 | 2/1994 | | |
| JP | 06152354 A | * 5/1994 | .......... | H03K/17/08 |
| JP | 06276071 A | * 9/1994 | .......... | H03K/17/08 |
| JP | 07-058293 | 3/1995 | | |
| JP | 8-316472 | 11/1996 | | |
| JP | 9-18310 | 1/1997 | | |
| JP | 11-163698 | 6/1999 | | |
| KR | 95-7167 | 3/1995 | | |
| WO | WO 97/45957 | 12/1997 | | |

OTHER PUBLICATIONS

H. Hagino, et al., T.IEE Japan, vol. 115–C, No. 1, pp. 117–126, "An Analysis of Generation Mechanisms of the Transitional Peak Current in Sense–Emmiter Current for IGBTs with Current Sense and Techniques to Remove it", 1995 (With partial English translation) No month.

* cited by examiner

Primary Examiner—Ronald W. Leja
(74) Attorney, Agent, or Firm—Oblon, Spivak, McClelland, Maier & Neustadt, P.C.

(57) ABSTRACT

The present invention relates to a technique of limiting an overcurrent of a power semiconductor element (1) such as an IGBT. In a background art overcurrent protection circuit (10P), when an emitter current (i) and a current sense current (is) do not show the same behavior even in a transient state, the current sense current tends to momentarily increase at a turnoff, and in such a case, the energizing capability of a MOSFET (2P) in the overcurrent protection circuit increases and the turnoff speed of an IGBT (1P) becomes much faster than necessary and as a result, a surge voltage disadvantageously increases. Then, in the present invention, a diode (5) having a forward voltage set not lower than a threshold voltage of the MOSFET (2) is so provided as a voltage clamping circuit (4) between a gate electrode (2G) and a source electrode (2S) as to be biased in the forward direction in an overcurrent protection circuit (10) of an IGBT (1). With this provision of the voltage clamping circuit (4), when a voltage value ($is \cdot R_s$) developed in a sense resistor (3) becomes equal to or higher than the forward voltage of the diode (5), the diode (5) is energized to clamp a gate voltage of the MOSFET (2) to the forward voltage.

20 Claims, 9 Drawing Sheets

OVERCURRENT CONTROL CIRCUIT OF POWER SEMICONDUCTOR DEVICE

TECHNICAL FIELD

The present invention relates to a technique of stabilizing a gate-voltage control type power semiconductor element, such as an insulated gate bipolar transistor (hereinafter, referred to as IGBT) and a vertical power MOSFET, in an overcurrent limiting.

BACKGROUND ART

Hereinafter, an overcurrent limiting of an IGBT will be discussed, as an example.

Figure 16:
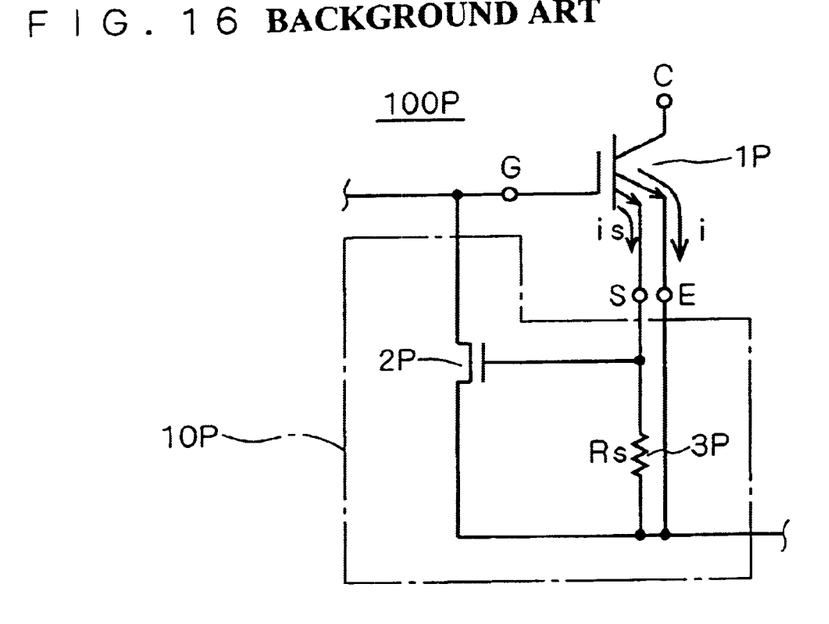
FIG. 16 is a view showing an example of a background-art overcurrent limiting circuit.

FIG. 16 shows an equivalent circuit of a semiconductor device 100P consisting of an IGBT 1P and its overcurrent limiting circuit 10P, as an example of the background art. In an emitter region of the IGBT 1P of this figure, a plurality of emitter cells are connected in parallel in order to pass a predetermined emitter current (main current) i. Further, the IGBT 1P incorporates a current detecting element (current sense portion) for detecting the emitter current i as well as a main portion, and outputs a current sense current is from a current sense terminal S connected to the current detecting element. Reference characters G, C and E represent a gate terminal, a collector terminal and an emitter terminal of the IGBT 1P, respectively.

Though a planar gate type IGBT which is obtained by microfabrication and a trench gate type IGBT have been developed as a high-performance IGBT in recent years, these IGBTs each have a number of channel regions per unit area and supposing a load short circuit state occurs, very large main current flows to increase energy loss, causing significant characteristic deterioration of the element. For this reason, in the IGBT, it is necessary to limit the main current by monitoring the current sense current is and lowering a gate voltage when an overcurrent flows. A monitoring circuit used for this purpose is the overcurrent limiting circuit.

In FIG. 16, the overcurrent limiting circuit 10P having a general configuration is shown. When a voltage between the current sense terminal S and the emitter terminal E, which is the product of the current sense current is similar to the emitter current i and the resistance value $R_S$ of a sense resistor 3P becomes equal to or higher than the threshold voltage of a current limiting n-type MOSFET 2P, the MOSFET 2P is turned on and electric charges accumulated in a gate region of the IGBT 1P is bypassed, to lower the gate voltage of the IGBT 1P and bring the IGBT 1P into an OFF state, thereby suppressing an increase in main current i. Further, this circuit 10P has an advantage of changing an overcurrent detection level by changing the resistance value $R_S$ of the sense resistor 3P and the threshold voltage of the MOSFET 2P.

Figure 17:
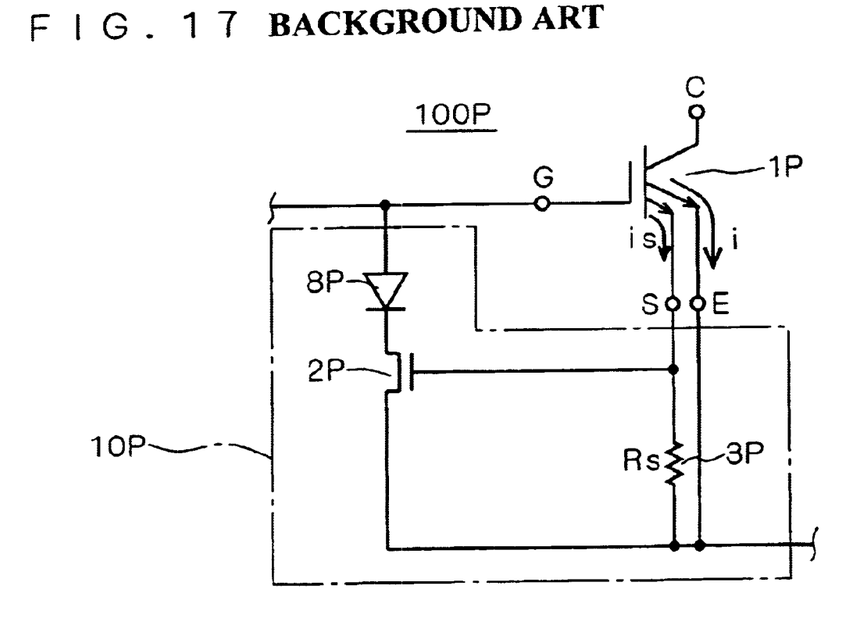
FIG. 17 is a view showing another example of the background-art overcurrent limiting circuit.

Furthermore, when a reverse bias is applied across the gate and emitter of the IGBT 1P, as shown in FIG. 17, the reverse bias is sustained by providing a diode 8P between the gate terminal G of the IGBT 1P and a drain of the MOSFET 2P.

Further, though the n-type MOSFET 2P is used as a current limiting transistor in FIGS. 16 and 17, a bipolar transistor may be used instead to produce the same effect.

The overcurrent limiting circuit 10P can achieve a stable overcurrent limiting when the emitter current i and the current sense current is show the same behavior even in a transient state.

On the transition of turnon and turnoff in a switching operation of the IGBT, however, there is a case where these currents i and is do not show the same behavior due to various factors. For example, there are cases (1) where the threshold voltage (Vthm) of the main portion and the threshold voltage (Vths) of the current sense portion are different from each other for internally structural reason of the IGBT and the relation Vthm>Vths is hold and (2) where the time constant which is defined by an internal gate resistance (Rgm) and a gate capacitance (Cm) of the main portion and the time constant which is defined by an internal gate resistance (Rgs) and a gate capacitance (Cs) of the current sense portion hold the relation (Rgm×Cm)<(Rgs×Cs) for designing reason. Then, in such cases (1) and (2), it is reported that there is a case where the attenuation of the current sense current is becomes slower than that of the main current i at the turnoff and the current sense current is momentarily increases (see "Analysis and Suppressing Method of Transient Peak Current In Current Detecting Unit Cell of IGBT With Current Sense", The Transactions of the Institute of Electrical Engineers of Japan. C, Vol. 115, No. 1).

In such a case, the overcurrent limiting circuit 10P illustrated in FIGS. 16 and 17 early becomes not able to perform the stable overcurrent suppressing function. Specifically, when the current sense current is momentarily increases due to the factors (1),(2) and the like, since the voltage which is the product of the current is flowing in the current sense portion and the resistance value $R_S$ of the sense resistor 3P rises to be over the voltage at the time when these currents i and is show the same behavior even in the load short circuit state, a voltage applied to the gate electrode of the current limiting MOSFET 2P becomes higher and the energizing capability of the MOSFET 2P becomes much higher than necessary. For this reason, the speed of lowering the gate voltage of the IGBT 1P becomes faster. When the speed of lowering the gate voltage becomes faster thus, the turnoff speed of the IGBT 1P becomes faster, and as a result, a surge voltage which is defined by a circuit inductance and the rate of change in current at the turnoff becomes higher and therefore there may be a case where the surge voltage exceeds the element breakdown voltage, depending on conditions.

These problems rise both in cases where the bipolar transistor is used as a current limiting transistor instead of the MOSFET 2P and where a vertical power MOSFET is used as a power semiconductor element.

DISCLOSURE OF INVENTION

The present invention is intended to solve the above problems, and an object of the present invention is to always achieve a stable overcurrent limiting operation without raising a turnoff speed of a power semiconductor element in an overcurrent limiting under any condition and in any state.

The present invention is directed to an overcurrent limiting circuit. According to a first aspect of the present invention, the overcurrent limiting circuit of a power semiconductor element which has first and second regions for passing a main current, a third region for controlling the main current which flows from the first region towards the second region, a current detecting region for passing a current sense current from the second region, and a first electrode terminal, a second electrode terminal, a third electrode terminal and a current sense terminal connected to the first region, the second region, the third region and the current detecting region, respectively, comprises: a resistor connected between the second electrode terminal and the current sense terminal; a transistor comprising a first main electrode, a second main electrode and a main control electrode connected to the third electrode terminal, the second electrode terminal and the current sense terminal, respectively, which comes into an ON state to pass a current from the first main electrode towards the second main electrode when a voltage not lower than a first control voltage is applied to the main control electrode; and a voltage clamping circuit connected between the main control electrode and the second main electrode of the transistor, for clamping a voltage applied to the main control electrode to a second control voltage not lower than the first control voltage when a voltage which is the product of the current sense current and the value of the resistor becomes a predetermined value not lower than the first control voltage.

According to a second aspect of the present invention, in the overcurrent limiting circuit of the first aspect, the voltage clamping circuit comprises a diode having a first electrode and a second electrode connected to the main control electrode and the second main electrode of the transistor, respectively, which comes into an ON state to pass a current from the first electrode towards the second electrode when the voltage which is the product of the current sense current and the value of the resistor becomes the predetermined value, and the second control voltage is defined on the basis of a voltage between the first electrode and the second electrode and not lower than the first control voltage.

According to a third aspect of the present invention, in the overcurrent limiting circuit of the second aspect, the diode is so connected as to be biased in the forward direction.

According to a fourth aspect of the present invention, in the overcurrent limiting circuit of the third aspect, the diode is a PN-junction diode.

According to a fifth aspect of the present invention, in the overcurrent limiting circuit of the second aspect, the diode is so connected as to be biased in the reverse direction.

According to a sixth aspect of the present invention, in the overcurrent limiting circuit of the third aspect, the diode is a PN-junction diode.

According to a seventh aspect of the present invention, in the overcurrent limiting circuit of the third aspect, the diode is a Schottky-barrier diode.

According to an eighth aspect of the present invention, in the overcurrent limiting circuit of the first aspect, the transistor is defined as a first transistor, the resistor comprises a first resistor having one end connected to the current sense terminal; and a second resistor having one end connected to the other end of the first resistor and the other end connected to the second electrode terminal, the voltage clamping circuit comprises a second transistor having a first electrode, a second electrode and a control electrode connected to the main control electrode and the second main electrode of the transistor and the other end of the first resistor, respectively, which comes into an ON state to pass a current from the first electrode towards the second electrode when the voltage which is the product of the current sense current and the value of the resistor becomes the predetermined value, a voltage between the first electrode and the second electrode of the second transistor in the ON state is set not lower than the first control voltage, and the second control voltage is defined on the basis of the voltage between the first electrode and the second electrode.

According to a ninth aspect of the present invention, in the overcurrent limiting circuit of the eighth aspect, the second transistor is a MOSFET.

According to a tenth aspect of the present invention, in the overcurrent limiting circuit of the first aspect, the second transistor is a bipolar transistor.

According to an eleventh aspect of the present invention, in the overcurrent limiting circuit of the first aspect, the first main electrode of the transistor comprises a first electrode; and a diode having one end and the other end connected to the third electrode terminal and the first electrode, respectively, and the diode passes a current from the one end towards the other end in the forward bias.

According to a twelfth aspect of the present invention, in the overcurrent limiting circuit of the first aspect, the transistor is a MOSFET.

According to a thirteenth aspect of the present invention, in the overcurrent limiting circuit of the first aspect, the transistor is a bipolar transistor.

According to a fourteenth aspect of the present invention, in the overcurrent limiting circuit of the first aspect, the resistor, the transistor and the voltage clamping circuit are integrated on a semiconductor substrate.

According to a fifteenth aspect of the present invention, the overcurrent limiting circuit of the first aspect is included in a semiconductor device having the power semiconductor element.

According to a sixteenth aspect of the present invention, the overcurrent limiting circuit of a power semiconductor element which has first and second regions for passing a main current, a third region for controlling the main current which flows from the first region towards the second region, a current detecting region for passing a current sense current from the second region, and a first electrode terminal, a second electrode terminal, a third electrode terminal and a current sense terminal connected to the first region, the second region, the third region and the current detecting region, respectively, comprises: a resistor connected between the second electrode terminal and the current sense terminal; a transistor comprising a first main electrode, a second main electrode and a main control electrode connected to the third electrode terminal, the second electrode terminal and the current sense terminal, respectively, which comes into an ON state to pass a current from the first main electrode towards the second main electrode when a voltage not lower than a first control voltage is applied to the main control electrode; and voltage clamping means connected between the main control electrode and the second main electrode of the transistor, for clamping the voltage applied to the main control electrode to a second control voltage not lower than the first control voltage when a voltage which is the product of the current sense current and the value of the resistor becomes a predetermined value not lower than the first control voltage.

The present invention is also directed to a semiconductor device. According to a seventeenth aspect of the present invention, the semiconductor device comprises: a power semiconductor element having first and second regions for passing a main current, a third region for controlling the main current which flows from the first region towards the second region, a current detecting region for passing a current sense current from the second region, and a first electrode terminal, a second electrode terminal, a third electrode terminal and a current sense terminal connected to the first region, the second region, the third region and the current detecting region, respectively; a resistor connected between the second electrode terminal and the current sense terminal; a transistor comprising a first main electrode, a second main electrode and a main control electrode connected to the third electrode terminal, the second electrode terminal and the current sense terminal, respectively, which comes into an ON state to pass a current from the first main electrode towards the second main electrode when a voltage not lower than a first control voltage is applied to the main control electrode; and a voltage clamping circuit connected between the main control electrode and the second main electrode of the transistor, for clamping a voltage applied to the main control electrode to a second control voltage not lower than the first control voltage when a voltage which is the product of the current sense current and the value of the resistor becomes a predetermined value not lower than the first control voltage.

In the overcurrent limiting circuit of the first to seventeenth aspects of the present invention, when the current sense current increases and the voltage which is the product of the current sense current and the value of the resistor reaches the voltage value not lower than the first control voltage, the voltage applied to the main control electrode of the transistor is clamped to the second control voltage which corresponds to the voltage value not lower than the first control voltage and the increase in energizing capability of the transistor is suppressed, and as a result, the speed or rate of lowering the control voltage applied to the third electrode terminal of the power semiconductor element is limited to a constant vale and does not become faster. Therefore, in the load short circuit state, even when the main current and the current sense current do not show the same behavior, the surge voltage of the power semiconductor element at the turnoff is nevertheless suppressed and a stable overcurrent limiting operation can be always achieved.

In the overcurrent limiting circuit of the third and fourth aspects of the present invention, particularly, since the first control voltage of the transistor and the forward voltage of the diode have the same temperature dependency, a much stabler overcurrent limiting operation can be achieved against temperature change.

These and other objects, features, aspects and advantages of the present invention will become more apparent from the following detailed description of the present invention when taken in conjunction with the accompanying drawings.

BEST MODE FOR CARRYING OUT THE INVENTION

The preferred embodiments of the present invention relate to a semiconductor device having at least ① a power semiconductor element and ② an overcurrent limiting circuit serving as a control circuit for controlling an overcurrent flowing in the power semiconductor element in a load short circuit state and the like. Herein, ① the power semiconductor element is a switching element having a gate electrode or a control electrode, for controlling the amount of main currents flowing between the first electrode terminal and the second electrode terminal in accordance with the control voltage applied to the gate electrode, and is, for example, an IGBT or a vertical power MOSFET. Moreover, the element has a current detecting region for generating and outputting a current sense current which is used to detect if the main current reaches the value by which it is evaluated to be in an overcurrent state. On the other hand, ② the overcurrent limiting circuit comprises at least (i) a sense resistor, (ii) a current limiting transistor and (iii) a voltage clamping circuit. Particularly, the voltage clamping circuit is a core of the preferred embodiments of the present invention, and is provided between the main control voltage and the second main electrode of the current limiting transistor and has a function of clamping the main control voltage of the current limiting transistor in accordance with a voltage developed in the sense resistor to control the energizing capability of the transistor not to increase over the capability at the clamp. In this case, a constitution in which the voltage clamping circuit uses a diode corresponds to the first and second preferred embodiments discussed later and a constitution in which the voltage clamping circuit is a switching element such as a MOSFET and a bipolar transistor corresponds to the third preferred embodiment.

The first to third preferred embodiments will be discussed below, referring to figures.

(The First Preferred Embodiment)

Figure 1:
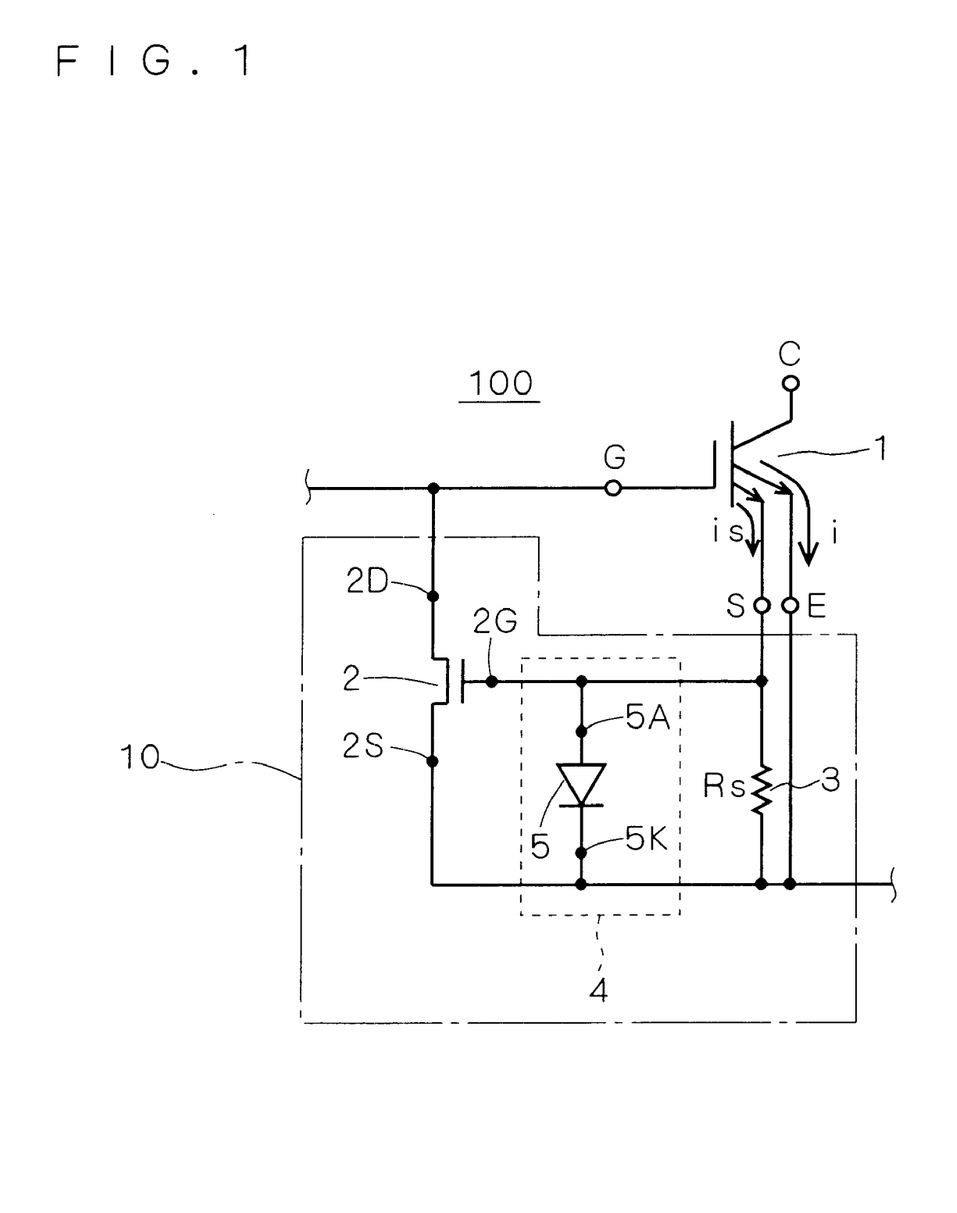
FIG. 1 is a view showing a circuit configuration of a semiconductor device in accordance with a first preferred embodiment of the present invention.
Figure 2:
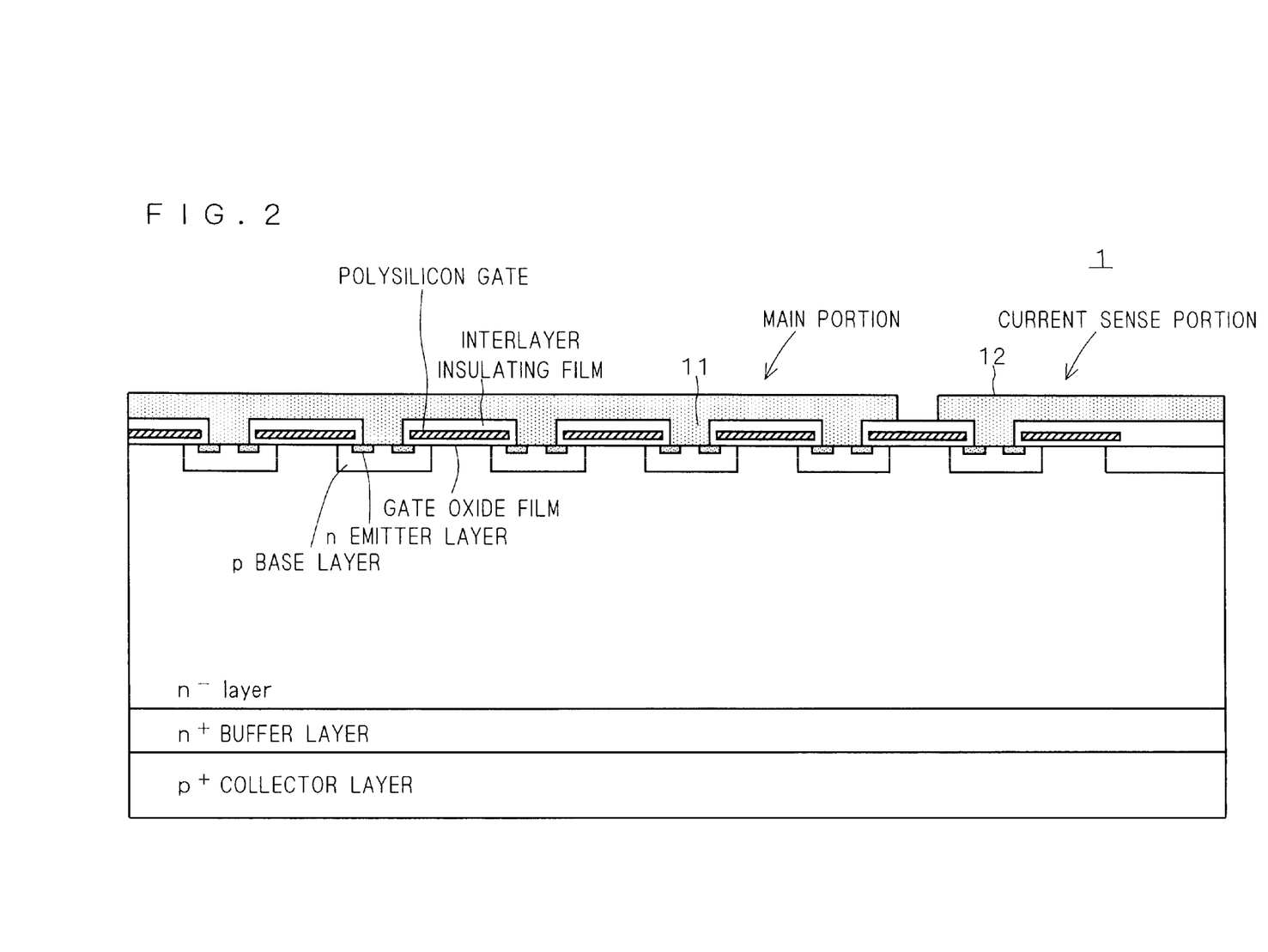
FIG. 2 is a vertical cross section partially showing an internal structure of an IGBT with a current sense.

FIG. 1 is a view showing a circuit configuration of a semiconductor device 100 in accordance with the first preferred embodiment of the present invention. This circuit 100 mainly consists of an IGBT 1 as a power semiconductor element and an overcurrent limiting circuit 10. Part of internal structure of the IGBT 1 is shown in FIG. 2.

Figure 4:
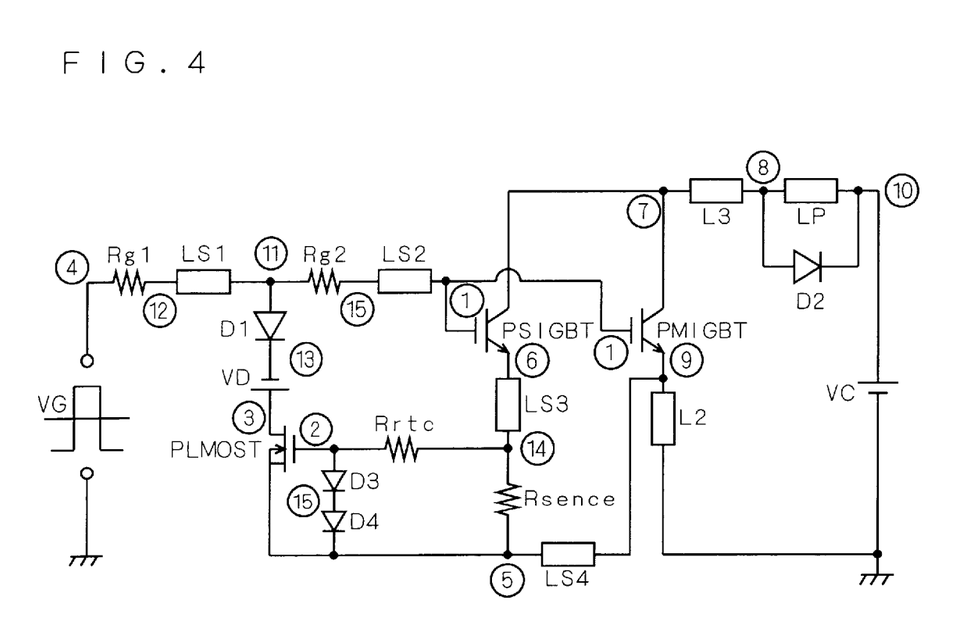
FIG. 4 is a view showing an equivalent circuit in a device simulation of a overcurrent limiting circuit in accordance with the first preferred embodiment of the present invention.

The IGBT 1 has a current sense function as well as a switching function, and is represented as an element in which a main portion PMIGBT and a current sense portion PSIGBT are connected in parallel to each other in an equivalent circuit, as shown in FIG. 4 described later. Specifically, as illustrated in FIG. 2, the IGBT 1 has a first region or a collector region and a second region or an emitter region for passing the main current i shown in FIG. 1 therebetween, a third region or a gate region for controlling the main current i, a current detecting region or a current sense region formed in the emitter region, for passing the current sense current is shown in FIG. 1 from the emitter region to the outside, a first electrode terminal or a collector terminal C (see FIG. 1) connected to a collector electrode (not shown) in the collector region, a second electrode terminal or an emitter terminal E (FIG. 1) connected to an emitter electrode 11 in the emitter region, a third electrode terminal or a gate terminal G (FIG. 1) connected to the gate electrode in the gate region and a current sense terminal S (FIG. 1) connected to a current sense electrode 12 in the current detecting region.

On the other hand, the overcurrent limiting circuit 10 has constituent elements shown in FIG. 1. Specifically, the circuit 10 has ① a sense resistor 3 connected between the emitter terminal E and the current sense terminal S, having the resistance value $R_S$ and ② a transistor 2 having a first main electrode 2D, a second main electrode 2S and a main control electrode 2G connected to the gate terminal G, the emitter terminal E and the current sense terminal S of the IGBT 1, respectively, being turned on to pass electric charges accumulated in the gate region of the IGBT 1 from the first main electrode 2D towards the second main electrode 2S as a bypass current when at least a first control voltage is applied to the main control electrode 2G. As an specific example of the transistor 2, a (npn-type or pnp-type) bipolar transistor may be used or a (n-type or p-type) MOSFET may be used. Herein, as the transistor 2 which is an element for lowering a gate voltage of the IGBT 1 in the overcurrent state, an n-type MOSFET is used. Therefore, the terminals 2D, 2S and 2G correspond to a drain electrode, a source electrode and a gate electrode, respectively, and the first control voltage corresponds to a threshold voltage of the MOSFET 2.

Further, the above circuit 10 also has ③ a voltage clamping circuit 4 constituted of at least one diode 5 which is so connected between the gate electrode 2G and the source electrode 2S of the MOSFET 2 as to be biased in the forward direction. A forward voltage of the diode 5 is set not lower than the threshold voltage of the MOSFET 2, and a first electrode or an anode electrode 5A and a second electrode or a cathode electrode 5K of the diode 5 is connected to the gate electrode 2G and the source electrode 2S, respectively. As a specific example of the diode 5, a Schottky-barrier diode may be used, but a PN-junction diode is preferably used.

In the overcurrent limiting circuit 10 having the above constitution, when the IGBT 1 is in an ON state and the main current i is in the range of normal values, since the voltage which is the product of the current sense current is and the resistance value $R_S$ is smaller than the forward voltage of the diode 5, the diode 5 is in an OFF state, the gate voltage of the MOSFET 2 is not clamped by the voltage clamping circuit 4, the above voltage value (is×$R_S$) is applied to the gate electrode 2G of the MOSFET 2 and the MOSFET 2 shows the energizing capability in accordance with the voltage. In contrast to this, under abnormal circumstances such as short circuit of an external load connected to the collector terminal C or the emitter terminal E of the device 100 and the like, the main current i increases to reach the current value which is evaluated to be overcurrent (into the overcurrent state) and the current sense current is accordingly increases, and as discussed earlier, when these currents i and is do not show the same behavior on the transition, the current sense current is momentarily makes a sharp increase. As a result, the voltage value (is×$R_S$) sharply increases, and in this process, when the voltage value (is×$R_S$) reaches a predetermined value, i.e., the value of the forward voltage of the diode 5, the diode 5 is turned on or brought into a conducting state, and the gate voltage (the voltage between current sense and emitter) of the MOSFET 2 is determined on the basis of the forward voltage and the voltage between current sense and emitter does not early exceed the forward voltage of the diode 5. In other words, in the state where the relation (the voltage value (is×$R_S$)≧the forward voltage of the diode 5) holds, the voltage clamping circuit 4 clamps the voltage applied to the gate electrode 2G of the MOSFET 2 to the second control voltage (constant value) which is equal to the forward voltage of the diode 5. With this clamping, the energizing capability of the MOSFET 2 can not early increase and becomes a constant value, and as a result, the MOSFET 2 stabilizes the speed of lowering the gate voltage of the IGBT 1 to the constant value and keeps the IGBT 1 in the OFF state.

Figure 3:
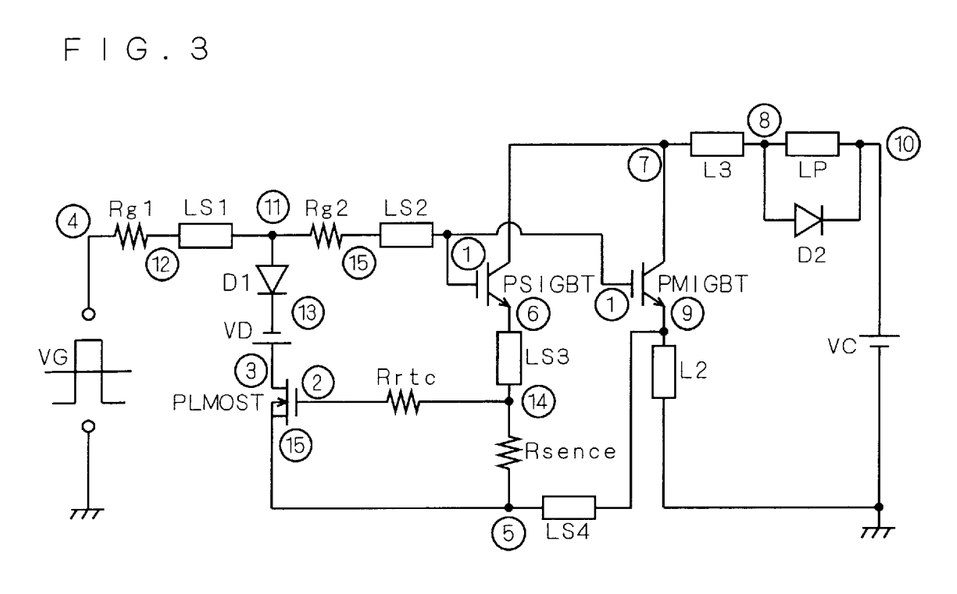
FIG. 3 is a view showing an equivalent circuit in a device simulation of a background-art overcurrent limiting circuit.

The inventor of the present invention made a device simulation on cases where the voltage clamping circuit 4 is provided and where no voltage clamping circuit 4 is provided, and the result will be shown below. First, FIGS. 3 and 4 show equivalent circuits used in the device simulation, and in particular, FIG. 3 shows a background-art current suppressing circuit and FIG. 4 shows a current suppressing circuit in the case where the voltage clamping circuit 4 consists of a plurality of diodes (D3 and D4 in this figure) and the diodes (D3 and D4) are so connected in series to each other as to be biased in the forward direction. Further, in FIGS. 3 and 4, reference sign LP represents an external load, D2 represents a free wheeling diode, reference signs L2 and L3 represent inductance components at the terminals and LS1 to LS4 represent parasitic inductance components on wires.

Figure 5:
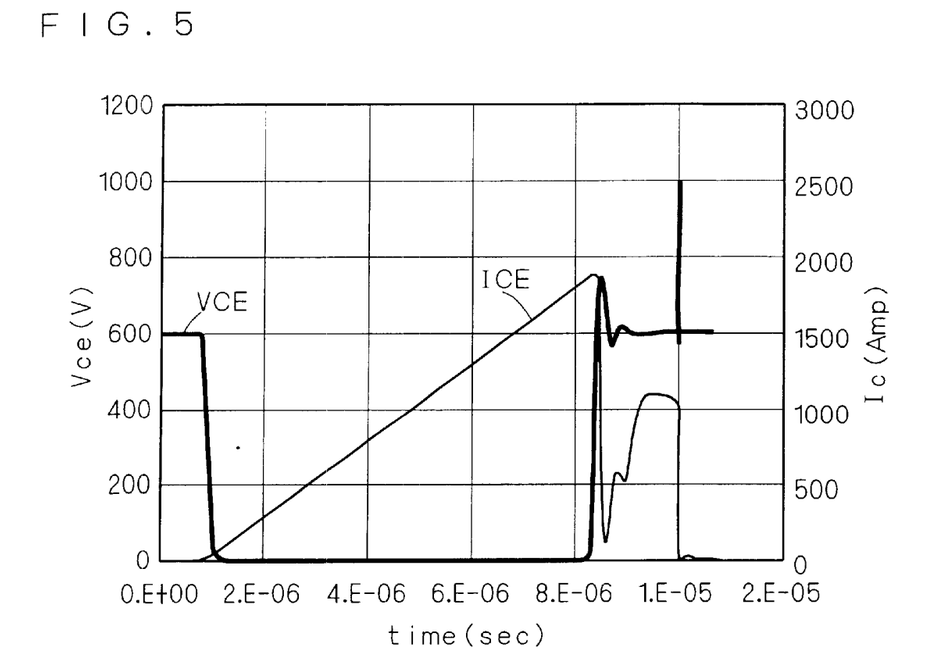
FIGS. 5 and 6 are views showing the result of the device simulation on the background-art overcurrent limiting circuit.
Figure 6:
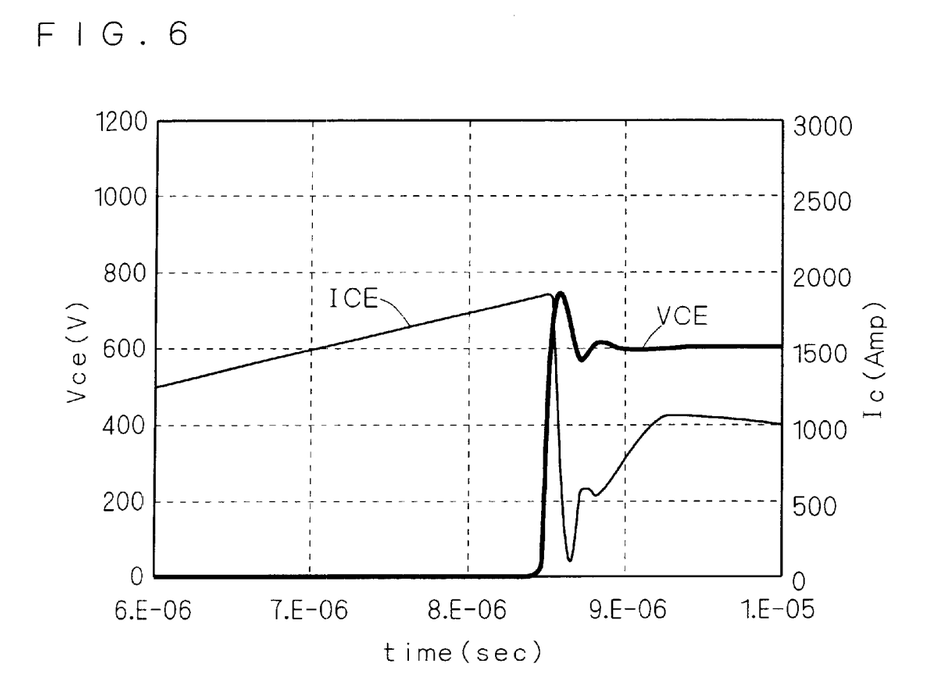

Next, FIG. 5 and FIG. 6 which is an enlarged view of FIG. 5 show switching waveforms as the result of the device simulation on the background-art circuit of FIG. 3 in a state where the load LP is short-circuited. As understood from FIG. 6, when the overcurrent limiting starts, i.e., when a main current ICE of the IGBT 1P starts decreasing from the maximum value, a collector-emitter voltage VCE momentarily reaches the maximum value over 700 V and the surge voltage at the turnoff is large.

Figure 7:
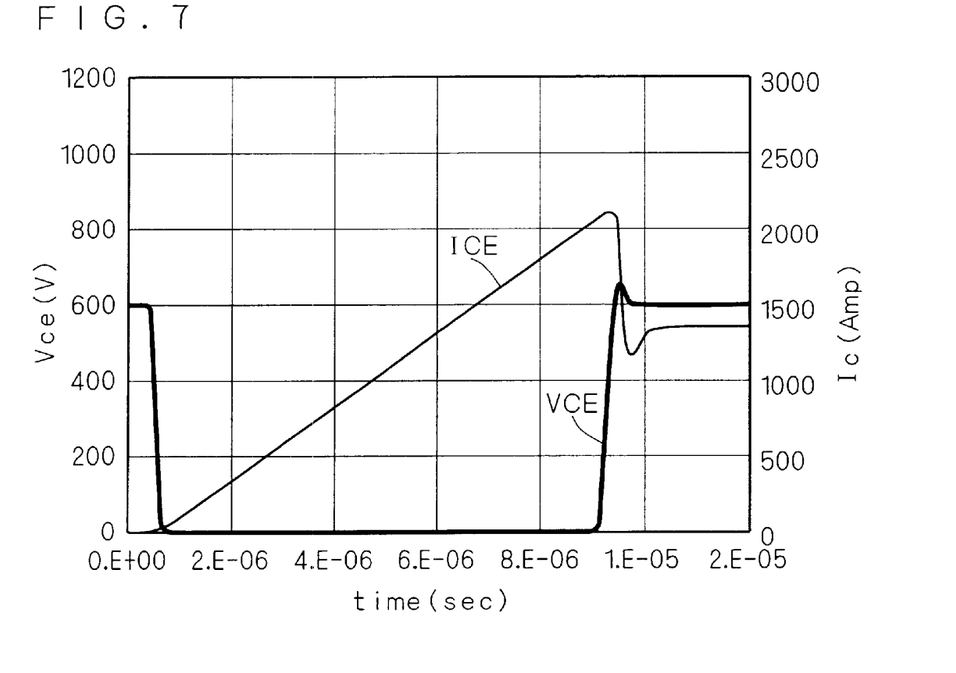
FIGS. 7 and 8 are views showing the result of the device simulation on the overcurrent limiting circuit in accordance with the first preferred embodiment of the present invention.
Figure 8:
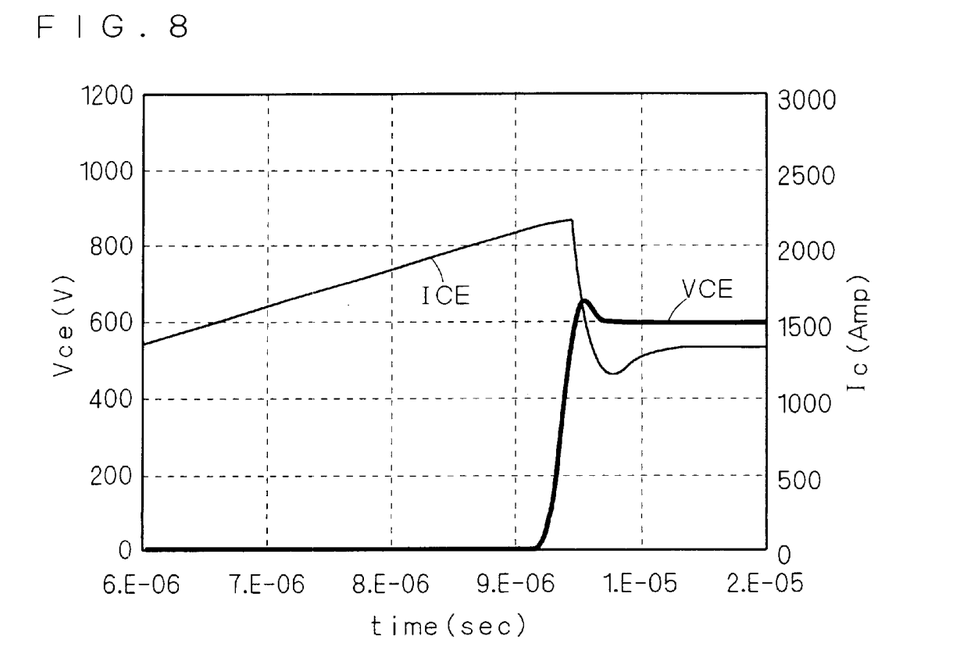

On the other hand, FIG. 7 and FIG. 8 which is an enlarged view of FIG. 7 show switching waveforms as the result of the device simulation on the circuit of FIG. 4 in the state where the load LP is short-circuited. As understood from FIG. 8, the maximum value which the collector-emitter voltage VCE of the IGBT 1 reaches immediately after the overcurrent limiting starts is lower than 700 V.

As understood from these simulation results, the overcurrent limiting circuit shown in FIGS. 1 and 4 suppresses the surge voltage at the turnoff in the overcurrent limiting state to lower level than the background-art overcurrent limiting circuit shown in FIGS. 16 and 3.

Further, when the diode 5 is manufactured in, e.g., polysilicon as discussed later, it is possible to easily change the forward voltage of the diode 5 with parameters of ① the area in a portion where the diode 5 is provided and ② the number of diodes connected in series. Changing the forward voltage of the diode 5 means changing the set value of the second control voltage, therefore leading to changing the energizing capability of the MOSFET 2 at the clamp of the gate voltage.

Moreover, the constitution of FIG. 1 has an advantage on temperature dependency. Specifically, both in the cases where a MOSFET is used as the overcurrent limiting transistor 2 and where a bipolar transistor is used, the threshold voltage of the transistor 2 has a negative dependency on temperature and therefore the temperature dependency of the forward characteristics of the diode 5 is also negative, this circuit 10 can achieve a stabler operation against temperature change.

Figure 9:
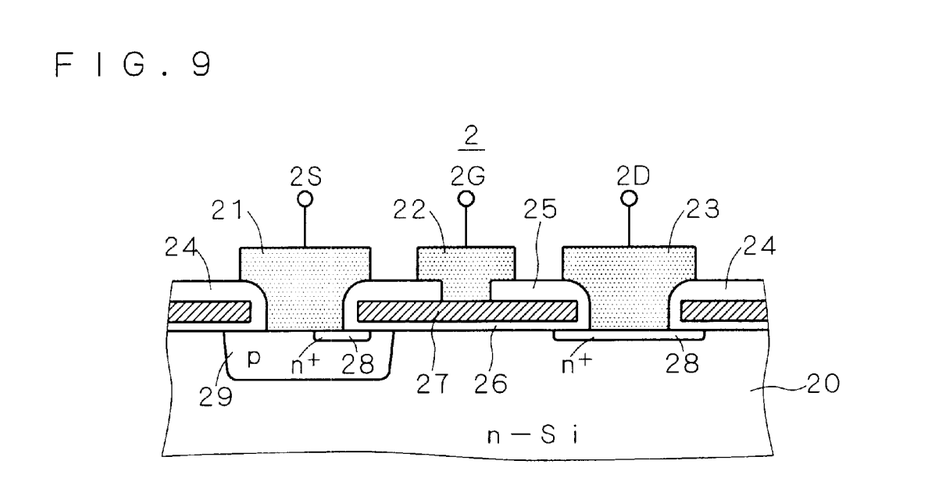
FIG. 9 is a vertical cross section showing a current limiting MOSFET of an overcurrent limiting circuit formed on a semiconductor substrate.
Figure 10:
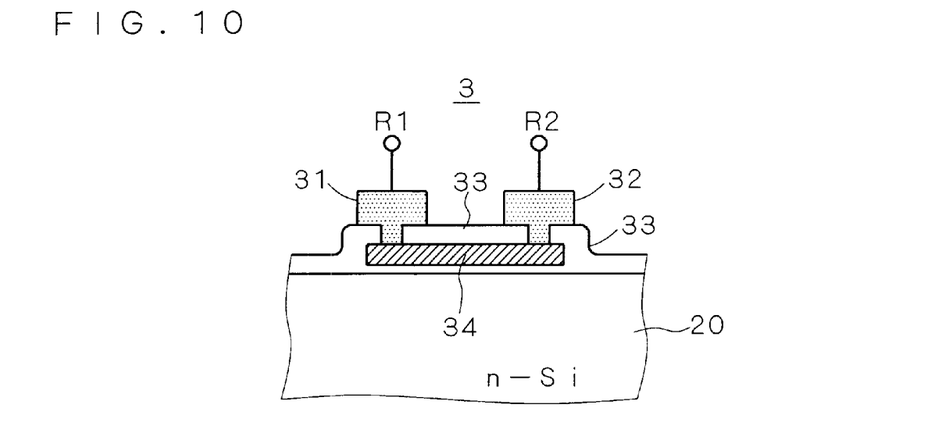
FIG. 10 is a vertical cross section showing a sense resistor of the overcurrent limiting circuit formed on the semiconductor substrate.
Figure 11:
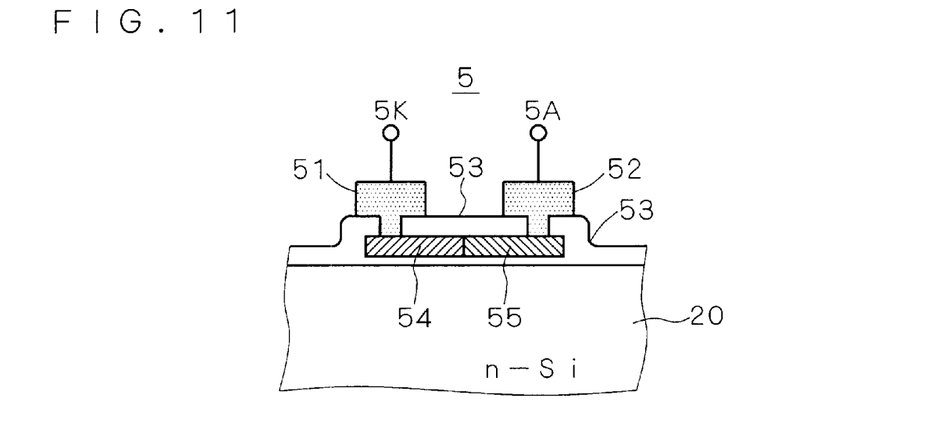
FIG. 11 is a vertical cross section showing a structure of a voltage clamping diode of the overcurrent limiting circuit formed on the semiconductor substrate as a PN-junction diode.

The constituent elements 2 to 4 of the overcurrent limiting circuit 10 shown in FIG. 1 may be discrete components which are mounted on a printed board, a ceramic substrate or the like to constitute the circuit 10. Instead, however, the components 2 to 4 may be each formed on one n-type or p-type silicon semiconductor substrate to constitute the circuit 10 as an integrated circuit. A specific example of constitution of the components 2 to 4 in the latter case will be shown in the vertical cross sections of FIGS. 9 to 11, taking a case where the semiconductor substrate as a base is an n-type silicon substrate. Reference numbers in FIGS. 9 to 11 represent as follows. Specifically, reference number 20 represents an n-type Si substrate, 21 represents a source electrode layer, 22 represents a gate electrode layer, 23 represents a drain electrode layer, reference numbers 24, 25, 33 and 53 represent $SiO_2$ film as insulating layers, reference number 26 represents an $SiO_2$ film as a gate insulating film, 27 represents a polysilicon layer as a gate electrode, 28 represents an n$^+$layer, 29 represents a p-type well region, 34 represents a resistance layer, 31 represents one of the terminals of the sense resistor 3, 32 represents the other terminal, 51 represents a cathode electrode layer, 52 represents an anode electrode layer, 54 represents an n-type polysilicon region and 55 represents a p-type polysilicon region.

Further, in a case where an npn-type bipolar transistor is used as the transistor 2 of the overcurrent limiting circuit 10, the first main electrode, the second main electrode and the main control electrode of the transistor 2 correspond to a collector electrode, an emitter electrode and a base electrode, respectively.

(Variation of The First Preferred Embodiment)

Figure 12:
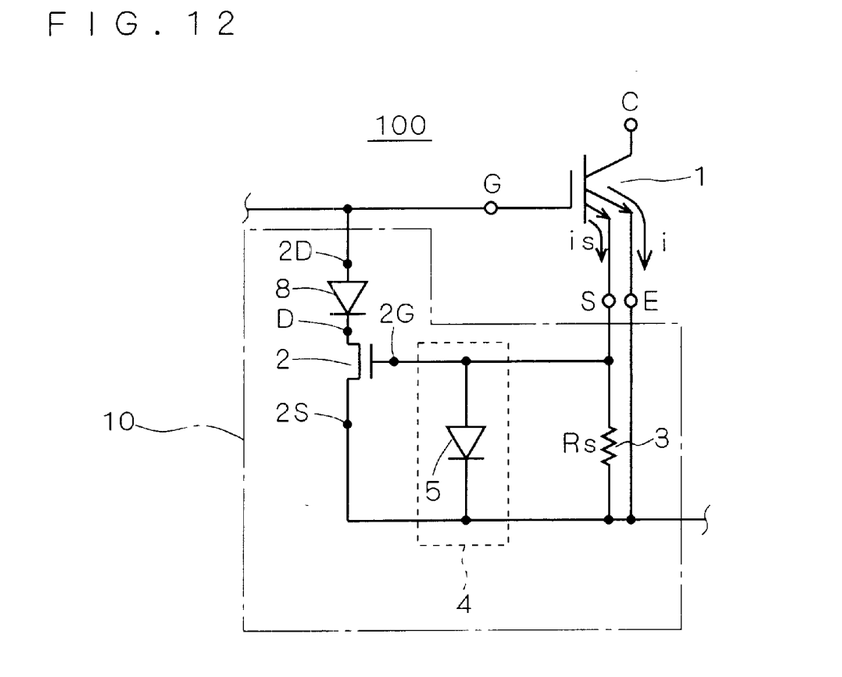
FIG. 12 is a view showing a circuit configuration of a semiconductor device in accordance with a variation of the first preferred embodiment.

The overcurrent limiting circuit 10 shown in FIG. 1 can be applied to a case where a diode 8 whose anode electrode and cathode electrode are connected to the gate terminal G of the IGBT 1 and the drain electrode of the current limiting MOSFET, respectively, is provided, like the case shown in FIG. 17. In this case, the first main electrode 2D of the transistor 2 consists of the first electrode D of the transistor 2 itself and the diode 8. An example of this constitution is shown in FIG. 12.

(The Second Preferred Embodiment)

The characteristic feature of the second preferred embodiment of the present invention lies in the voltage clamping circuit consisting of at least one diode (which is a common feature with the first preferred embodiment) and positive use of the reverse voltage or breakdown voltage of the diode as a clamp voltage. This point will be discussed in detail below, referring to figures.

Figure 13:
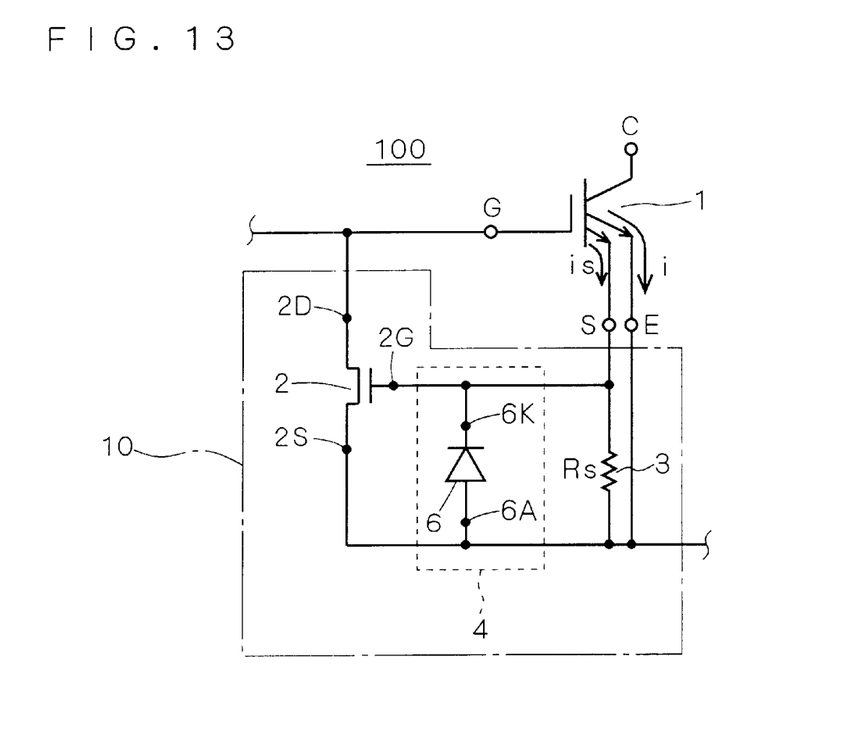
FIG. 13 is a view showing a circuit configuration of a semiconductor device in accordance with a second preferred embodiment of the present invention.

FIG. 13 is a view showing a configuration of the semiconductor device 100, accordingly, of the IGBT 1 and the overcurrent limiting circuit 10 in accordance with the second preferred embodiment of the present invention. Also in this figure, an n-type MOSFET is used as the transistor 2 which is an element for lowering the gate voltage of the IGBT 1 in the overcurrent state. Further, herein, a diode 6 is so connected between the gate electrode 2G and the source electrode 2S of the MOSFET 2 as to be biased in the reverse direction, to constitute the voltage clamping circuit 4. The breakdown voltage of the diode 6 is set not lower than the threshold voltage of the MOSFET 2.

Thus, the second control voltage which is the clamp voltage is equal to the breakdown voltage of the diode 6 in the second preferred embodiment. Specifically, when the product of the resistance value $R_S$ of the sense resistor 3 and the current sense current is is lower than the breakdown voltage of the diode 6, the gate voltage of the MOSFET 2 is determined by the voltage value (is×$R_S$), but when the above voltage value (is×$R_S$) increases to be equal to or higher than the breakdown voltage of the diode 6, the diode 6 is turned on and as a result, a voltage higher than the breakdown voltage of the diode 6 is not early applied to the gate electrode 2G of the MOSFET 2 and the same effect as in the first preferred embodiment can be produced.

Further, in a case where the diode 6 is a PN-junction diode and manufactured in a polysilicon as shown in FIG. 10, it is possible to easily change the breakdown voltage of the diode 6 with parameters of concentrations of the P layer and N layer.

Figure 14:
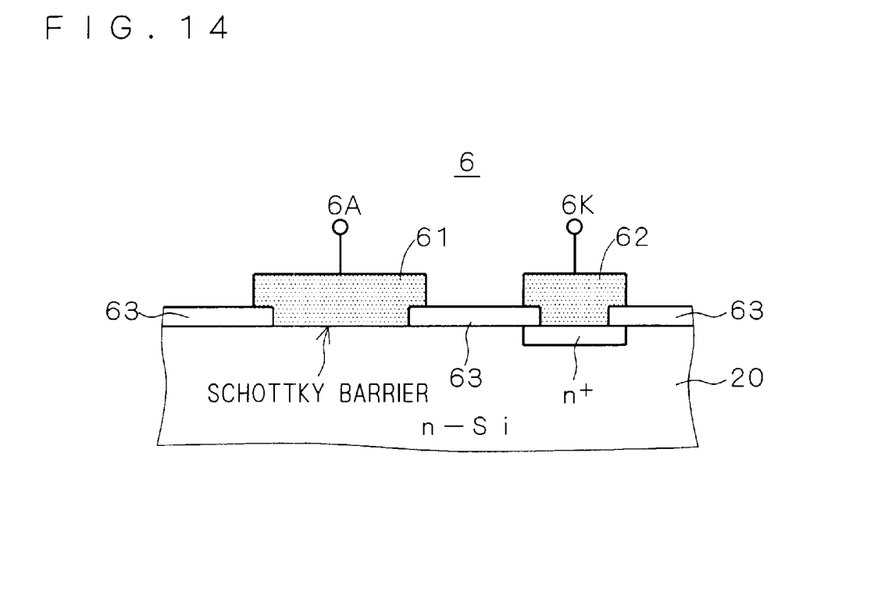
FIG. 14 is a vertical cross section showing a structure of the voltage clamping diode of the overcurrent limiting circuit formed on the semiconductor substrate as a Schottky-barrier diode.

Furthermore, constitution of the diode 6 as a Schottky-barrier diode also produces a preferable result in the present case. An example of integration of the diode 6 in this case is shown in FIG. 14. In this figure, reference number 61 represents an anode layer and 62 represents a cathode layer, and both the layers 61 and 62 are alloy layers in which Si is contained in an Al layer (aluminum layer) at 1%. Further, reference number 63 represents an $SiO_2$ film (insulating film).

(The Third Preferred Embodiment)

In the third preferred embodiment, the current liming transistor 2 described in the first and second preferred embodiments is defined as "a first transistor". Further, the voltage clamping circuit 4 is formed of a second transistor. For this reason, the sense resistor 3 is divided into first and second resistors, and the control electrode of the second transistor is connected to a node between the first and second resistors and a voltage (which corresponds to the above-discussed second control voltage) between the first electrode and the second electrode of the second transistor in the ON state is set not lower than the above-discussed first control voltage of the first transistor. The characteristic feature of the third preferred embodiment will be discussed in detail below, referring to figures.

Figure 15:
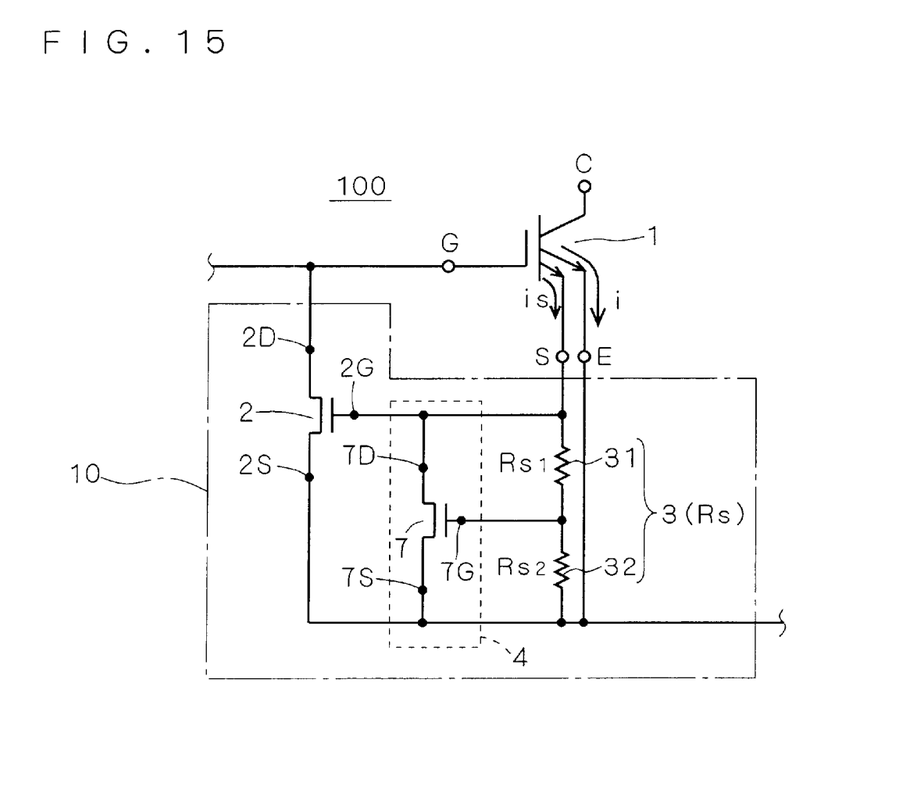
FIG. 15 is a view showing a circuit configuration of a semiconductor device in accordance with a third preferred embodiment of the present invention.

FIG. 15 is a view showing a configuration of the IGBT 1 and the overcurrent limiting circuit 10 in accordance with the third preferred embodiment of the present invention. Also in this figure, an n-type MOSFET is used as the transistor 2 which is an element for lowering the gate voltage of the IGBT 1 in the overcurrent state. Further, in the third preferred embodiment, a clamping n-type MOSFET having a first electrode or a drain electrode 7D and a second electrode or a source electrode 7S connected to the gate electrode 2G and the source electrode 2S of the MOSFET 2, respectively, is used as the second transistor 7 constituting the voltage clamping circuit 4. Moreover, a control electrode or a gate electrode 7G of the clamping MOSFET 7 is connected to one end of a first resistor 31 having a resistance value $R_{S1}$ whose other end is connected to the current sense terminal S or one end of a second resistor 32 having a resistance value $R_{S2}$. In addition, a drain-source voltage („or the second control electrode) of the MOSFET 7 in the ON state is set not lower than the threshold voltage („or the first control voltage) of the MOSFET 2.

Now, when the voltage which is the product of the resistance value $R_S$ of the sense resistor 3 and the current sense current is is lower than a predetermined value, in other words, when a voltage developed in the second resistor 32 is lower than the threshold voltage of the MOSFET 7, the gate voltage of the MOSFET 2 is determined by the voltage value (is×$R_S$) and the MOSFET 2 has the energizing capability in accordance with the gate voltage thereof.

Herein considered is a case where an abnormal circumstance such as a load short circuit causes an overcurrent state of the main current i. At this time, when the voltage value (is×$R_S$) sharply increases to be not lower than a predetermined value determined by a relation of the threshold value of the MOSFET 2 and the resistance dividing ratio of the sense resistor 3, the voltage (is×$R_{S2}/(R_{S1}+R_{S2})$) developed in the second resistor 32 becomes not lower than the threshold voltage of the MOSFET 7 and the MOSFET 7 is turned on. At this time, the gate voltage of the MOSFET 2 is clamped to the drain-source voltage of the MOSFET 7 in the ON state ($\geq$ the threshold voltage of the MOSFET 2) and thereafter does not become higher than that value. As a result, the energizing capability of the MOSFET 2 is stabilized and the speed of lowering the gate voltage of the IGBT 1 is stabilized to a constant value, to suppress the surge voltage at the turnoff.

Also in the third preferred embodiment, a p-type MOSFET or a bipolar transistor may be used as an exemplary constitution of the second transistor 7.

Further, the overcurrent limiting circuit 10 shown in FIG. 15 can be applied to a case where the diode 8 is provided as shown in FIG. 17.

Furthermore, the overcurrent limiting circuit 10 shown in FIG. 15 may be integrated like the structures of FIGS. 9 and 10 as discussed earlier.

(Note)

The semiconductor device 100 itself described in the first to third preferred embodiments can be integrated on the silicon substrate.

While the invention has been shown and described in detail, the foregoing description is in all aspects illustrative and not restrictive. It is therefore understood that numerous modifications and variations can be devised without departing from the scope of the invention.

INDUSTRIAL APPLICABILITY

The semiconductor device in accordance with the present invention can be applied to a converter device, an inverter device or a auxiliary power supply device in, e.g., electric railway field, and further can be also applied to an active filter, or a converter device or an inverter device for high-volume manufacture in steel rolling field and the like.

What is claimed is:

1. An overcurrent limiting circuit of a power semiconductor element which has first and second regions for passing a main current, a third region for controlling said main current which flows from said first region towards said second region, a current detecting region for passing a current sense current from said second region, and a first electrode terminal, a second electrode terminal, a third electrode terminal, and a current sense terminal connected to said first region, said second region, said third region, and said current detecting region, respectively, comprising:

a resistor connected between said second electrode terminal and said current sense terminal;

a transistor comprising a first main electrode, a second main electrode, and a main control electrode connected to said third electrode terminal, said second electrode terminal, and said current sense terminal, respectively, which comes into an ON state to pass a current from said first main electrode towards said second main electrode when a voltage not lower than a first control voltage is applied to said main control electrode; and a voltage clamping circuit connected between said main control electrode and said second main electrode of said transistor, for clamping a voltage applied to said main control electrode to a second control voltage not lower than said first control voltage when a voltage which is a product of said current sense current and a value of said resistor becomes a predetermined value not lower than said first control voltage.

2. The overcurrent limiting circuit according to claim 1, wherein said voltage clamping circuit comprises a diode having a first electrode and a second electrode connected to said main control electrode and said second main electrode of said transistor, respectively, which comes into an ON state to pass a current from said first electrode towards said second electrode when said voltage which is the product of said current sense current and the value of said resistor becomes said predetermined value, and said second control voltage is defined based on a voltage between said first electrode and said second electrode and not lower than said first control voltage.

3. The overcurrent limiting circuit according to claim 2, wherein said diode is so connected as to be biased in a forward direction.

4. The overcurrent limiting circuit according to claim 3, wherein said diode is a PN-junction diode.

5. The overcurrent limiting circuit according to claim 3, wherein said diode is a PN-junction diode.

6. The overcurrent limiting circuit according to claim 3, wherein said diode is a Schottky-barrier diode.

7. The overcurrent limiting circuit according to claim 2, wherein said diode is so connected as to be biased in a reverse direction.

8. The overcurrent limiting circuit according to claim 1, wherein said transistor is defined as a first transistor, said resistor comprises a first resistor having one end connected to said current sense terminal; and a second resistor having one end connected to the other end of said first resistor and the other end connected to said second electrode terminal, said voltage clamping circuit comprises:

a second transistor having a first electrode, a second electrode, and a control electrode connected to said main control electrode and said second main electrode of said transistor and said other end of said first resistor, respectively, which comes into an ON state to pass a current from said first electrode towards said second electrode when said voltage which is the product of said current sense current and the value of said resistor becomes said predetermined value, a voltage between said first electrode and said second electrode of the second transistor in the ON state is set not lower than said first control voltage, and said second control voltage is defined based on said voltage between said first electrode and said second electrode.

9. The overcurrent limiting circuit according to claim 8, wherein said second transistor is a MOSFET.

10. The overcurrent limiting circuit according to claim 8, wherein said second transistor is a bipolar transistor.

11. The overcurrent limiting circuit according to claim 1, wherein
said first main electrode of said transistor comprises a first electrode; and further comprising:
a diode having one end and the other end connected to said third electrode terminal and said first electrode, respectively, said diode passing a current from said one end towards said other end in the forward bias.

12. The overcurrent limiting circuit according to claim 1, wherein said transistor is a MOSFET.

13. The overcurrent limiting circuit according to claim 1, wherein said transistor is a bipolar transistor.

14. The overcurrent limiting circuit according to claim 1, wherein said resistor, and transistor, and said voltage clamping circuit are integrated on a semiconductor substrate.

15. The overcurrent limiting circuit according to claim 1, being included in a semiconductor device having said power semiconductor element.

16. An overcurrent limiting circuit of a power semiconductor element which has first and second regions for passing a main current, a third region for controlling said main current which flows from said first region towards said second region, a current detecting region for passing a current sense current from said second region, and a first electrode terminal, a second electrode terminal, a third electrode terminal, and a current sense terminal connected to said first region, said second region, said third region, and said current detecting region, respectively, comprising:
a resistor connected between said second electrode terminal and said current sense terminal;
a transistor comprising a first main electrode, a second main electrode, and a main control electrode connected to said third electrode terminal, said second electrode terminal, and said current sense terminal, respectively, which comes into an ON state to pass a current from said first main electrode towards said second main electrode when a voltage not lower than a first control voltage is applied to said main control electrode; and
voltage clamping means connected between said main control electrode and said second main electrode of said transistor, for clamping a voltage applied to said main control electrode to a second control voltage not lower than said first control voltage when a voltage which is a product of said current sense current and a value of said resistor becomes a predetermined value not lower than said first control voltage.

17. A semiconductor device, comprising:
a power semiconductor element having first and second regions for passing a main current, a third region for controlling said main current which flows from said first region towards said second region, a current detecting region for passing a current sense current from said second region, and a first electrode terminal, a second electrode terminal, a third electrode terminal, and a current sense terminal connected to said first region, said second region, said third region, and said current detecting region, respectively;
a resistor connected between said second electrode terminal and said current sense terminal;
a transistor comprising a first main electrode, a second main electrode, and a main control electrode connected to said third electrode terminal, said second electrode terminal, and said current sense terminal, respectively, which comes into an ON state to pass a current from said first main electrode towards said second main electrode when a voltage not lower than a first control voltage is applied to said main control electrode; and
a voltage clamping circuit connected between said main control electrode and said second main electrode of said transistor, for clamping a voltage applied to said main control electrode to a second control voltage not lower than said first control voltage when a voltage which is a product of said current sense current and a value of said resistor becomes a predetermined value not lower than said first control voltage.

18. An overcurrent limiting circuit of a power semiconductor element which has first and second regions for passing a main current, a third region for controlling said main current which flows from said first region towards said second region, a current detecting region for passing a current sense current from said second region, and a first electrode terminal, a second electrode terminal, a third electrode terminal, and a current sense terminal connected to said first region, said second region, said third region, and said current detecting region, respectively, comprising:
a resistor connected between said second electrode terminal and said current sense terminal;
a first transistor comprising a first main electrode, a second main electrode, and a main control electrode connected to said third electrode terminal, said second electrode terminal, and said current sense terminal, respectively, which comes into an ON state to pass a current from said first main electrode towards said second main electrode when a voltage not lower than a first control voltage is applied to said main control electrode; and
a voltage clamping circuit connected between said main control electrode and said second main electrode of said first transistor, for clamping a voltage applied to said main control electrode to a second control voltage not lower than said first control voltage when a voltage which is a product of said current sense current and a value of said resistor becomes a predetermined value not lower than said first control voltage,
said voltage clamping circuit comprises:
a second transistor having a first electrode, a second electrode, and a control electrode connected to said main control electrode and said second main electrode of said transistor and said other end of said first resistor, respectively, which comes into an ON state to pass a current from said first electrode towards said second electrode when said voltage which is the product of said current sense current and the value of said resistor becomes said predetermined value,
a voltage between said first electrode and said second electrode of the second transistor in the ON state is set not lower than said first control voltage, and
said second control voltage is defined based on said voltage between said first electrode and said second electrode.

19. The overcurrent limiting circuit according to claim 18, wherein said second transistor is a MOSFET.

20. The overcurrent limiting circuit according to claim 18, wherein said second transistor is a bipolar transistor.

* * * * *